(12) United States Patent
Omoto et al.

(10) Patent No.: US 9,099,032 B2
(45) Date of Patent: Aug. 4, 2015

(54) LIGHT-EMITTING PANEL, DISPLAY DEVICE AND ELECTRONIC EQUIPMENT

(71) Applicant: Sony Corporation, Tokyo (JP)

(72) Inventors: Keisuke Omoto, Kanagawa (JP); Shinichi Teraguchi, Kanagawa (JP)

(73) Assignee: JOLED INC. (JP)

( * ) Notice: Subject to any disclaimer, the term of this patent is extended or adjusted under 35 U.S.C. 154(b) by 0 days.

(21) Appl. No.: 14/260,886

(22) Filed: Apr. 24, 2014

(65) Prior Publication Data

US 2014/0232276 A1 Aug. 21, 2014

Related U.S. Application Data

(63) Continuation of application No. 13/439,001, filed on Apr. 4, 2012, now Pat. No. 8,742,675.

(30) Foreign Application Priority Data

Apr. 11, 2011 (JP) ................................. 2011-087417

(51) Int. Cl.
G09G 3/30 (2006.01)
H01L 27/32 (2006.01)

(52) U.S. Cl.
CPC ................ *G09G 3/30* (2013.01); *H01L 27/322* (2013.01); *H01L 27/3272* (2013.01); *H01L 27/3262* (2013.01)

(58) Field of Classification Search
None
See application file for complete search history.

(56) References Cited

U.S. PATENT DOCUMENTS

2006/0131587 A1* 6/2006 Sato et al. ........................ 257/72
2010/0053044 A1* 3/2010 Lee et al. ......................... 345/80
2011/0062434 A1* 3/2011 Eguchi et al. ................... 257/43
2011/0089416 A1* 4/2011 Yamazaki et al. .............. 257/43

* cited by examiner

*Primary Examiner* — Crystal L Hammond
(74) *Attorney, Agent, or Firm* — Sheridan Ross P.C.

(57) ABSTRACT

Disclosed herein is a light-emitting panel including: an organic electroluminescence element adapted to emit electroluminescence light toward a transparent substrate; a pixel circuit formed on the transparent substrate and adapted to drive the organic electroluminescence element; a color filter formed not only between the transparent substrate and organic electroluminescence element but also immediately on or above the pixel circuit; and a conductive layer formed between the pixel circuit and color filter, the conductive layer being more conductive than the color filter.

12 Claims, 14 Drawing Sheets

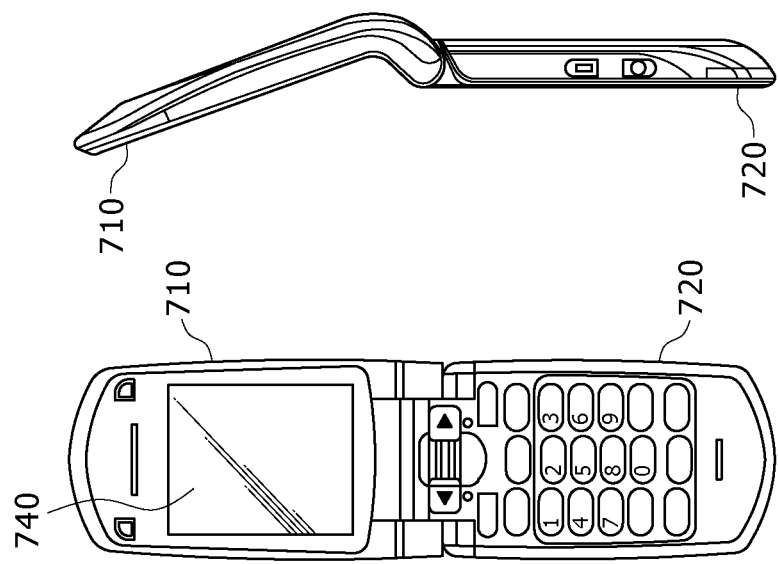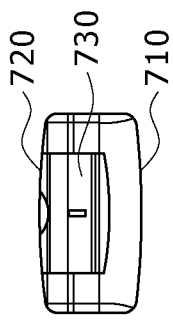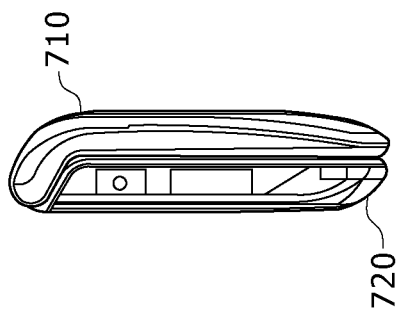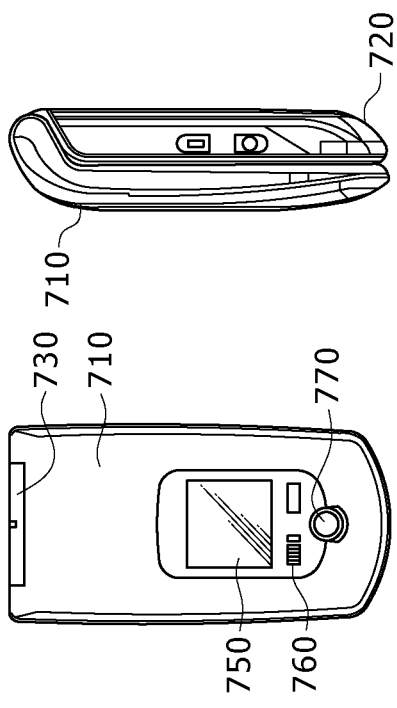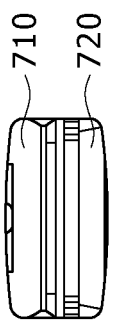

LIGHT-EMITTING PANEL, DISPLAY DEVICE AND ELECTRONIC EQUIPMENT

CROSS-REFERENCE TO RELATED APPLICATIONS

This application is a continuation of U.S. patent application Ser. No. 13/439,001, filed Apr. 4, 2012, which claims priority to Japanese Patent Application No. 2011-087417, filed in the Japan Patent Office on Apr. 11, 2011, the entire disclosures of which are hereby incorporated herein by reference.

BACKGROUND

The present disclosure relates to a light-emitting panel having an organic EL (electro luminescence) element, a display device having the same light-emitting panel and electronic equipment having the same display device.

Recent years have seen the development of current-driven optical elements such as organic EL elements for use as a light-emitting element of a pixel and efforts undertaken to make them commercially available in the field of display devices adapted to display an image (refer, for example, to Japanese Patent Laid-Open No. 2008-083272). The emission brightness of these current-driven optical elements changes according to the current flowing therethrough. Organic EL elements are self-luminous unlike liquid crystal elements. This eliminates the need for a display device using organic EL elements (organic EL display device) to have a light source (backlight), thus providing higher image visibility, lower power consumption and faster element response than liquid crystal display devices for which a light source is necessary.

Organic EL display devices are classified into two types, passive matrix and active matrix display devices, depending on a driving method thereof, just as are liquid crystal display devices. The former is simpler in structure. However, it is difficult for this type of organic EL display device to grow into a large-size and high definition display device. Today, therefore, increasing efforts are being made to develop active matrix models. This type of display device is designed to control the current flowing through the light-emitting element provided in each of the pixels using active elements (commonly TFTs (Thin Film Transistors) provided in a drive circuit that is provided for each of the light-emitting elements.

SUMMARY

Incidentally, the structure adapted to extract EL light can be classified into two types, bottom emission and top emission structures. With the former or bottom emission structure, a color filter is formed on TFT circuitry. However, the color filter becomes charged when it receives EL light from the organic EL element, thus changing the TFT characteristic because of the charge collected on the color filter.

For example, it is clear as illustrated in FIG. 16 that the TFT characteristic of an n-channel transistor with a color filter, provided thereon or thereabove, irradiated with EL light is different from that with no color filter near the n-channel transistor. More specifically, the TFT threshold voltage has moved in the negative direction, with a greater leak current in the OFF condition. If a TFT whose characteristic has undergone such a change is used as a write transistor, the charge held by the holding capacitor in the pixel circuit leaks during the light emission period, thus resulting in lower brightness.

The present disclosure has been made in light of the foregoing, and it is desirable to provide a light-emitting panel that can reduce the change in characteristic of the pixel circuit caused by the charging of the color filter, a display device having the same light-emitting panel and electronic equipment having the same display device.

A light-emitting panel according to an embodiment of the present disclosure includes an organic EL element, pixel circuit, color filter and conductive layer in each pixel. Here, the organic EL element emits EL light toward a transparent substrate. The pixel circuit drives the organic EL element and is formed on the transparent substrate. The color filter is formed not only between the transparent substrate and organic EL element but also immediately on or above the pixel circuit. The conductive layer is made of a material more conductive than the color filter and formed between the pixel circuit and color filter.

A display device according to the embodiment of the present disclosure includes the above light-emitting panel as a display panel and further includes a drive circuit adapted to drive the display panel. Electronic equipment according to the embodiment of the present disclosure includes the above display device.

In the light-emitting panel, display device and electronic equipment according to the embodiment of the present disclosure, the conductive layer more conductive than the color filter is formed between the pixel circuit and color filter in the bottom emission light-emitting panel. This reduces the tendency of the pixel circuit to be affected by the charging of the color filter as a result of the reception of EL light emitted from the organic EL element.

In the present disclosure, the pixel circuit includes, for example, a holding capacitor, and first and second transistors. The first transistor writes a predetermined voltage to the holding capacitor. The second transistor drives the organic EL element based on the voltage of the holding capacitor. If the pixel circuit is configured as described above, and if the color filter is formed immediately on or above the first transistor, it is preferred that the conductive layer should be formed between the first transistor and color filter.

Further, in the present disclosure, the first transistor includes, for example, a gate, source, drain and channel. If the first transistor is configured as described above, it is preferred that the conductive layer should cover part of the channel of all the region of the first transistor opposed to the color filter. Still further, it is more preferred that the conductive layer should cover at least the terminal, i.e., the channel, source or drain, which is externally supplied with a signal because this makes the pixel circuit less affected by the charging of the color filter.

Still further, in the present disclosure, the first transistor may be insulated from the conductive layer by an insulating layer for isolation. Alternatively, in the present disclosure, the conductive layer may electrically float. Still alternatively, the conductive layer may be electrically connected to a conductive member different from the conductive layer so as to assume a predetermined potential.

In the light-emitting panel, display device and electronic equipment according to the embodiment of the present disclosure, the conductive layer more conductive than the color filter is formed between the pixel circuit and color filter, thus reducing the change in characteristic of the pixel circuit caused by the charging of the color filter.

BRIEF DESCRIPTION OF THE DRAWINGS

FIG. 13A is a front view of application example 5 in an open position, FIG. 13B is a side view thereof, FIG. 13C is a front view in a closed position, FIG. 13D is a left side view, FIG. 13E is a right side view, FIG. 13F is a top view, and FIG. 13G is a bottom view;

DETAILED DESCRIPTION OF THE PREFERRED EMBODIMENT

A detailed description will be given below of the preferred embodiment of the present disclosure with reference to the accompanying drawings. It should be noted that the description will be given in the following order.
1. Embodiment
   Example in which a conductive layer is provided immediately on or above the pixel circuit
2. Module and Application Examples
<1. Embodiment>
[Configuration]

Figure 1:
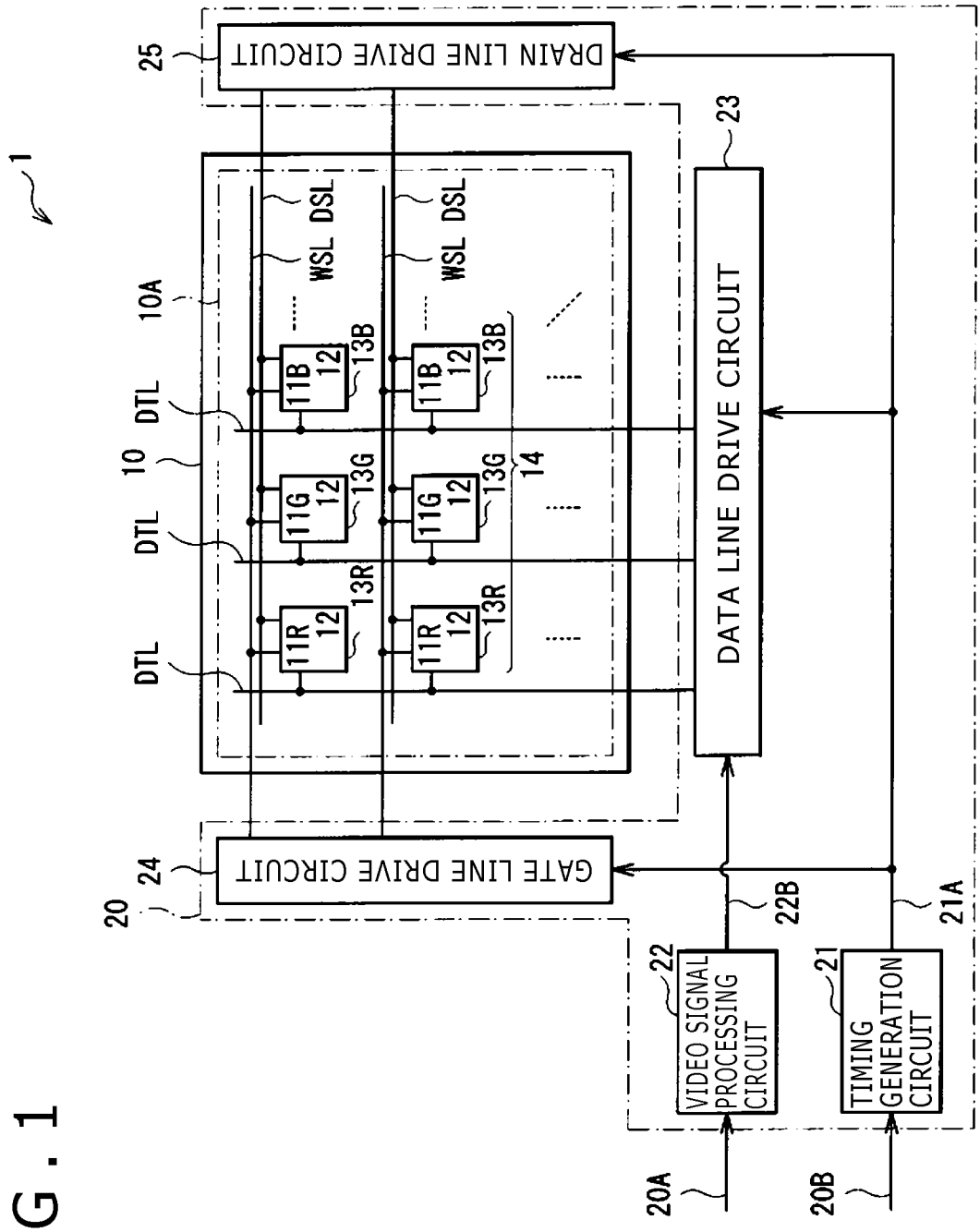
FIG. 1 is a schematic diagram of a display device according to an embodiment of the present disclosure.

FIG. 1 illustrates an example of overall structure of a display device 1 according to an embodiment of the present disclosure. The display device 1 includes a display panel 10 and drive circuit 20 adapted to drive the display panel 10.

The display panel 10 has a display region 10A in which a plurality of display pixels 14 are arranged two-dimensionally. The display panel 10 displays an image based on an eternally fed video signal 20A by active matrix driving of each of the display pixels 14. Each of the display pixels 14 includes a red subpixel 13R, green subpixel 13G and blue subpixel 13B. It should be noted that the subpixels 13R, 13G and 13B are collectively referred to as the subpixels 13 in the description given below.

Figure 2:
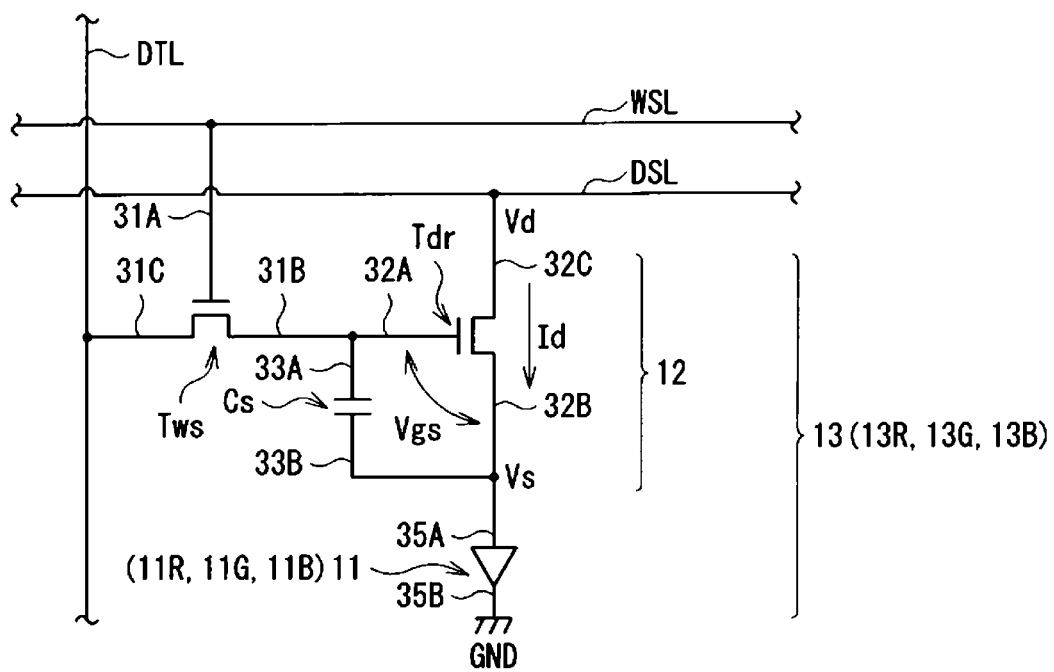
FIG. 2 is a circuit diagram of a subpixel shown in FIG. 1.

FIG. 2 illustrates an example of circuit configuration of the subpixel 13. The subpixel 13 includes an organic EL element 11 and pixel circuit 12 adapted to drive the organic EL element 11 as illustrated in FIG. 2. It should be noted that an organic EL element 11R adapted to emit red EL light is provided as an organic EL element in the subpixel 13R. Similarly, an organic EL element 11G adapted to emit green EL light is provided as an organic EL element in the subpixel 13G, and an organic EL element 11B adapted to emit blue EL light is provided as an organic EL element in the subpixel 13B.

The pixel circuit 12 is, for example, a two-transistor/one-capacitor (2Tr1C) circuit including a write transistor Tws, drive transistor Tdr and holding capacitor Cs. It should be noted that the pixel circuit 12 is not limited to a two-transistor/one-capacitor circuit. Alternatively, the pixel circuit 12 may include two write transistors Tws that are connected to each other in series. Still alternatively, the pixel circuit 12 may include transistors or capacitors different from the above.

The write transistor Tws writes a voltage commensurate with the video signal 20A to the holding capacitor Cs. The drive transistor Tdr drives the organic EL element 11 based on the voltage of the holding capacitor Cs written by the write transistor Tws. The write transistor Tws and drive transistor Tdr include, for example, n-channel MOS (Metal Oxide Semiconductor) thin film transistors (TFTs). It should be noted that the write transistor Tws and drive transistor Tdr may include p-channel MOS TFTs.

It should be noted that the write transistor Tws according to the present embodiment corresponds to a specific example of a "first transistor," and that the drive transistor according to the present embodiment corresponds to a specific example of a "second transistor." Further, the holding capacitor Cs corresponds to a specific example of a "holding capacitor."

The drive circuit 20 includes a timing generation circuit 21, video signal processing circuit 22, data line drive circuit 23, gate line drive circuit 24 and drain line drive circuit 25. The drive circuit 20 also includes data lines DTL, gate lines WSL and drain lines DSL. Each of the data lines DTL is connected to one of the outputs of the data line drive circuit 23. Each of the gate lines WSL is connected to one of the outputs of the gate line drive circuit 24. Each of the drain lines DSL is connected to one of the outputs of the drain line drive circuit 25. The drive circuit 20 still further includes a ground line GND (refer to FIG. 2) that is connected to the cathode of the organic EL element 11. It should be noted that the ground line GND is connected to the ground and assumes the ground voltage when connected to the ground.

The timing generation circuit 21 controls the data line drive circuit 23, gate line drive circuit 24 and drain line drive circuit 25, for example, so that these circuits operate in concert with each other. The timing generation circuit 21 outputs a control signal 21A to these circuits, for example, in response to (in synchronism with) an externally fed synchronizing signal 20B.

The video signal processing circuit 22, for example, corrects the externally fed digital video signal 20A, converts the corrected video signal into an analog signal and outputs a resultant signal voltage 22B to the data line drive circuit 23.

The data line drive circuit 23 writes the signal voltage 22B fed from the video signal processing circuit 22 to the selected display pixel 14 (or subpixel 13) via the data line DTL in response to (in synchronism with) the input of the control signal 21A. The data line drive circuit 23 can output, for example, two voltages, i.e., the signal voltage 22B and a constant voltage irrelevant to the video signal.

The gate line drive circuit 24 applies a selection pulse to the plurality of gate lines WSL one after another in response to (in synchronism with) the input of the control signal 21A, thus selecting the plurality of display pixels 14 (or subpixels 13) on the gate line WSL-by-gate line WSL basis. The gate line drive circuit 24 can output, for example, two voltages, i.e., a voltage applied to turn ON the write transistor Tws and another applied to turn OFF the write transistor Tws.

The drain line drive circuit 25 outputs a predetermined voltage to the drain of the drive transistor of each of the pixel circuits 12 via the drain line DSL in response to (in synchronism with) the input of the control signal 21A. The drain line drive circuit 25 can output, for example, two voltages, i.e., a voltage applied to cause the organic EL element 11 to emit light and another applied to cause the organic EL element 11 to stop emitting light.

Figure 3:
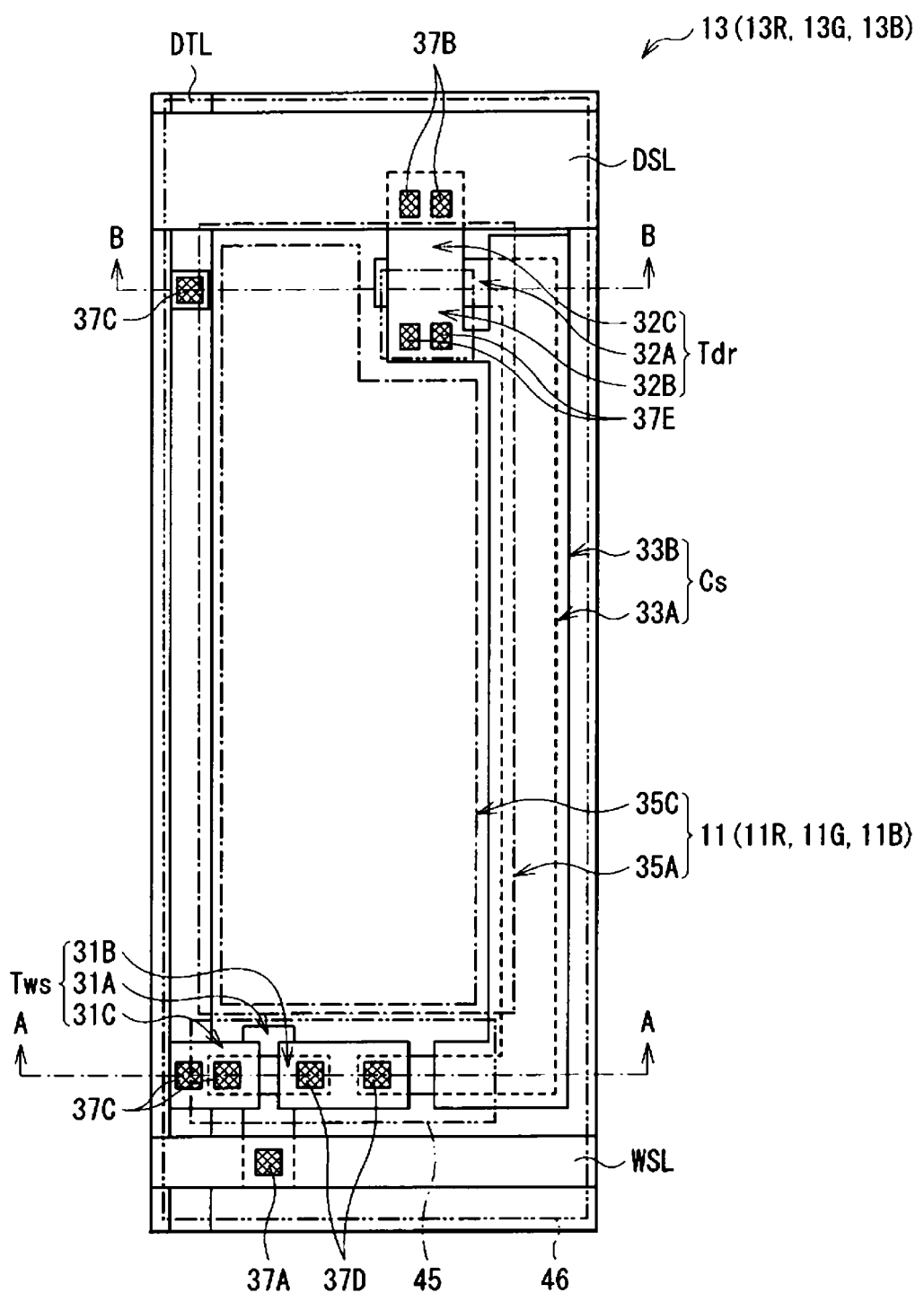
FIG. 3 is a layout of the components of the subpixel shown in FIG. 1.

A description will be given next of the connection between the components and their layout with reference to FIGS. 2 and 3. It should be noted that FIG. 3 illustrates an example of layout of the components of the subpixel 13.

Each of the gate lines WSL is formed to extend in the row direction and connected to a gate 31A of the write transistor Tws via a contact 37A. Each of the drain lines DSL is also formed to extend in the row direction and connected to a drain 32C of the drive transistor Tdr via contacts 37B. Each of the data lines DTL is formed to extend in the column direction and connected to a drain 31C of the write transistor Tws via contacts 37C.

A source 31B of the write transistor Tws is connected to a gate 32A of the drive transistor Tdr and one end (terminal 33A) of the holding capacitor Cs via contacts 37D. A source 32B of the drive transistor Tdr and the other end (terminal 33B) of the holding capacitor Cs are connected to an anode 35A of the organic EL element 11 via contacts 37E. An organic layer 35C of the organic EL element 11 is arranged in a region on the anode 35A and not opposed to the write transistor Tws or drive transistor Tdr. A cathode 35B of the organic EL element 11 is arranged on an organic layer 35C and connected to the ground line GND. The cathode 35B is formed, for example, over the entire surface of the display region 10A.

Figure 4:
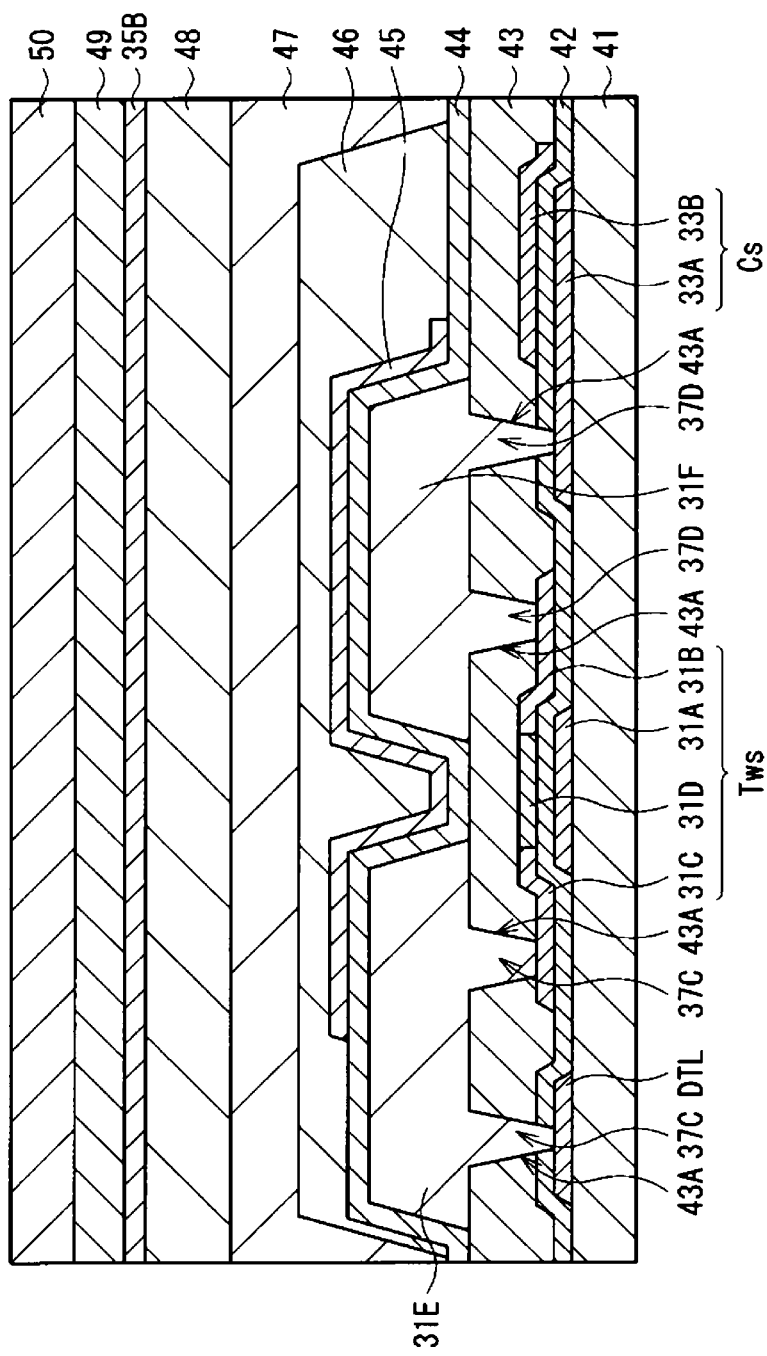
FIG. 4 is a diagram illustrating an example of cross-sectional structure of the subpixel shown in FIG. 3 as seen in the direction of arrow A-A.

A description will be given next of the cross-sectional structure of the write transistor Tws and the region close thereto in the display panel 10. FIG. 4 illustrates an example of cross-sectional structure of the subpixel 13 shown in FIG. 3 as seen in the direction of arrow A-A. The display panel 10 includes, for example, the write transistor Tws, holding capacitor Cs and data line DTL in the write transistor Tws and the region close thereto on a substrate 41 as illustrated in FIG. 4. The display panel 10 has, for example, a gate insulating layer 42, insulating layers 43 and 44, conductive layer 45, color filter 46, insulating layers 47 and 48, the cathode 35B, an insulating layer 49 and substrate 50 stacked in this order from the side of the substrate 41 in the write transistor Tws and the region close thereto as illustrated in FIG. 4.

The insulating layer 43 has openings 43A, and the display panel 10 has the contact 37C or 37D in each of the openings 43A. The display panel 10 has a drain lead-out electrode 31E immediately on the contacts 37C. The drain lead-out electrode 31E is electrically connected to the data line DTL and drain 31C via the contacts 37C. Further, the display panel 10 has a source lead-out electrode 31F immediately on the contacts 37D. The source lead-out electrode 31F is electrically connected to the source 31B and the terminal 33A of the holding capacitor Cs via the contacts 37D.

The insulating layer 44 fully covers the drain lead-out electrode 31E, source lead-out electrode 31F and insulating layer 43, insulating these electrodes and the conductive layer 45 from each other. The conductive layer 45 is made of a material more conductive than the color filter 46. The conductive layer 45 is made of a transparent conductive material such as ITO (Indium Tin Oxide). If made of a transparent conductive material, the conductive layer 45 can be formed in the openings of the subpixel 13. It should be noted that the conductive layer 45 may be made, for example, of a metallic material. In this case, however, it is preferred that the conductive layer 45 should be formed only immediately above the write transistor Tws (or drain lead-out electrode 31E and source lead-out electrode 31F) in such a manner as to avoid the openings of the subpixel 13 as illustrated in FIG. 3.

The conductive layer 45 covers, for example, at least a channel 31D of the write transistor Tws of all the region of the write transistor Tws opposed to the color filter 46 as illustrated in FIG. 4. It is preferred that the conductive layer 45 should cover, for example, at least the source lead-out electrode 31F, i.e., the terminal on the opposite side of that externally supplied with a signal, of all the region of the write transistor Tws opposed to the color filter 46, i.e., the channel 31D, drain lead-out electrode 31E and source lead-out electrode 31F, as illustrated in FIG. 4. The conductive layer 45 is, for example, not connected to any other conductive member and, therefore, electrically floats. It should be noted that the conductive layer 45 need not necessarily electrically float. Instead, the conductive layer 45 may be, for example, electrically connected to a conductive member different from the conductive layer 45 and, therefore, assume a predetermined potential.

The color filter 46, for example, fully covers the subpixel 13 as illustrated in FIG. 3. The color filter 46 is formed not only between the substrate 41 and organic EL element 11 but also immediately above the pixel circuit 12. The color filter 46 is also formed, for example, immediately above the write transistor Tws as illustrated in FIG. 4. In the present embodiment, however, the conductive layer 45 is provided between the color filter 46 and write transistor Tws. Therefore, even if the color filter 46 becomes charged as a result of reception of EL light from the organic EL element 11, the pixel circuit 12 (especially, the write transistor Tws) does not readily become affected by the charging of the color filter 46.

Figure 5:
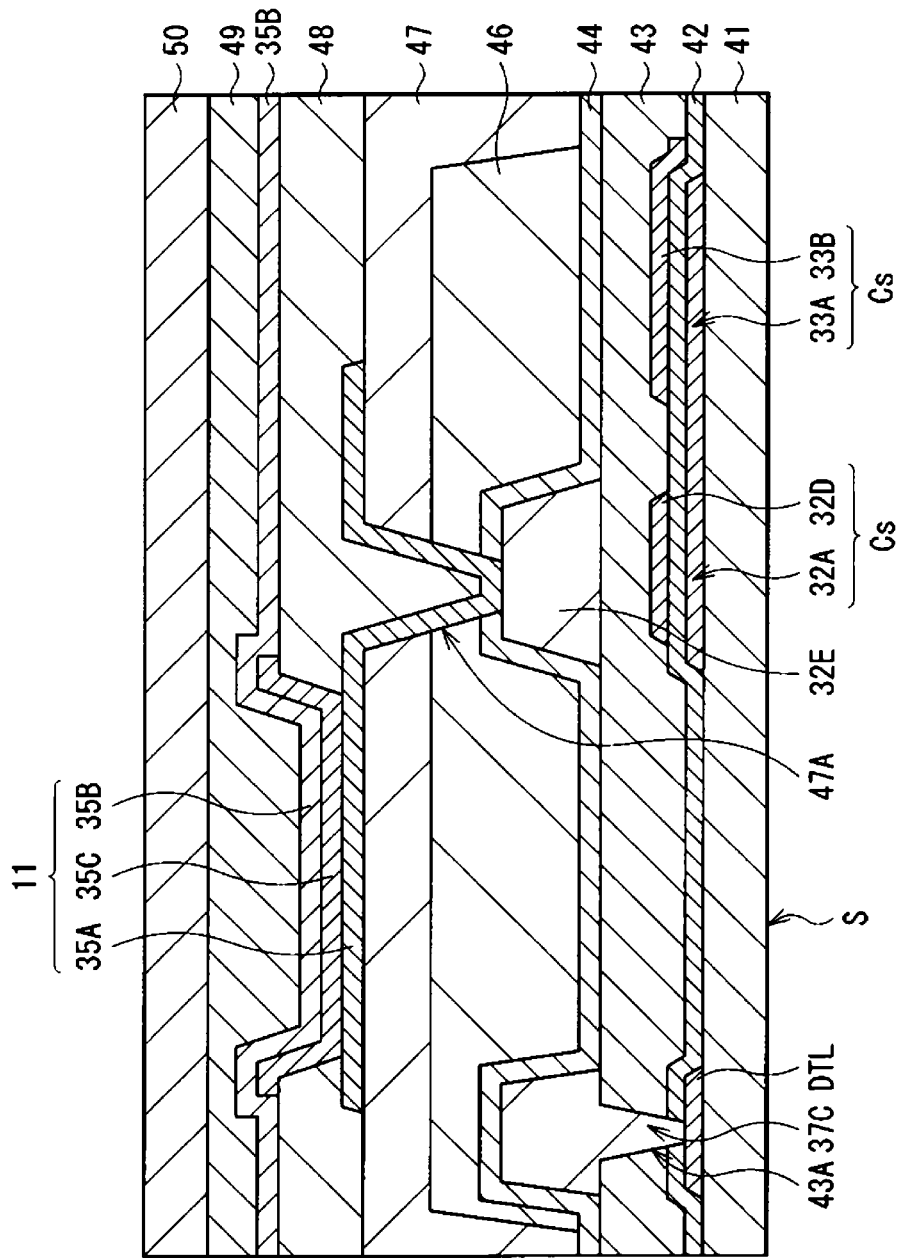
FIG. 5 is a diagram illustrating an example of cross-sectional structure of the subpixel shown in FIG. 3 as seen in the direction of arrow B-B.

A description will be given next of the cross-sectional structure of the drive transistor Tdr and the region close thereto in the display panel 10. FIG. 5 illustrates an example of cross-sectional structure of the subpixel 13 shown in FIG. 3 as seen in the direction of arrow B-B. The display panel 10 includes the drive transistor Tdr, holding capacitor Cs and data line DTL in the drive transistor Tdr and the region close thereto on the substrate 41 as illustrated in FIG. 4. The display panel 10 has, for example, the gate insulating layer 42, insulating layers 43 and 44, color filter 46, insulating layers 47 and 48, organic EL element 11, insulating layer 49 and substrate 50 stacked in this order from the side of the substrate 41 in the drive transistor Tdr and the region close thereto as illustrated in FIG. 5.

The insulating layer 43 has the opening 43A, and the display panel 10 has the contact 37C in the opening 43A. Although not shown, the display panel 10 has a drain lead-out electrode immediately on the contacts 37B (refer to FIG. 3). The drain lead-out electrode is electrically connected to the drain 32C of the drive transistor Tdr via the contacts 37B. Further, the display panel 10 has a source lead-out electrode 32E immediately on the contacts 37E (refer to FIG. 3). The source lead-out electrode 32E is electrically connected to the source 32B of the drive transistor Tdr via the contacts 37E.

The anode 35A of the organic EL element 11 is connected to the source lead-out electrode 32E via the insulating layer 47 and an opening 47A formed in the color filter 46. The anode 35A has a flat region formed on the flat surface of the insulating layer 47, and the organic layer 35C is formed in contact with the flat region of the anode 35A. The cathode 35B is formed at least in contact with the top surface of the organic layer 35C and serves, for example, as a common electrode formed over the entire surface including the organic layer 35C and insulating layer 48.

Here, the substrate 41 includes, for example, a substrate transparent to EL light such as glass or resin substrate. The substrate 50 includes, for example, a glass, silicon (Si) or resin substrate. The anode 35A is made of a conductive material transparent to visible light such as ITO. The organic layer 35C includes, for example, a hole injection layer, hole transport layer, light-emitting layer and electron transport layer that are stacked in this order from the side of the anode 35A. The hole injection layer provides enhanced hole injection efficiency. The hole transport layer provides enhanced hole transport efficiency to the light-emitting layer. The light-emitting layer emits light as a result of the recombination of electrons and holes. The electron transport layer provides enhanced electron transport efficiency to the light-emitting layer. The cathode 35B is made of a metallic material and serves as a reflecting mirror. This ensures that light emitted from the organic layer 35C of the organic EL element 11 is externally output via the anode 35A, insulating layer 48, color filter 46, insulating layers 44, 43 and 42 and substrate 41. Therefore, the rear side of the substrate 41 (side opposite to that on which the drive transistor Tdr is provided) serves as a video display surface S. As a result, the display panel 10 has a bottom emission structure.

[Operation]

A description will be given next of an example of operation of the display device 1 according to the present embodiment.

In this display device 1, the signal voltage 22B commensurate with the video signal 20A is applied to each of the data lines DTL by the data line drive circuit 23. At the same time, a selection pulse commensurate with the control signal 21A is applied to the plurality of gate lines WSL and drain lines DSL by the gate line drive circuit 24 and drain line drive circuit 25 one after another. Practically, a picture is displayed as a result of the operation described below.

Figure 6:
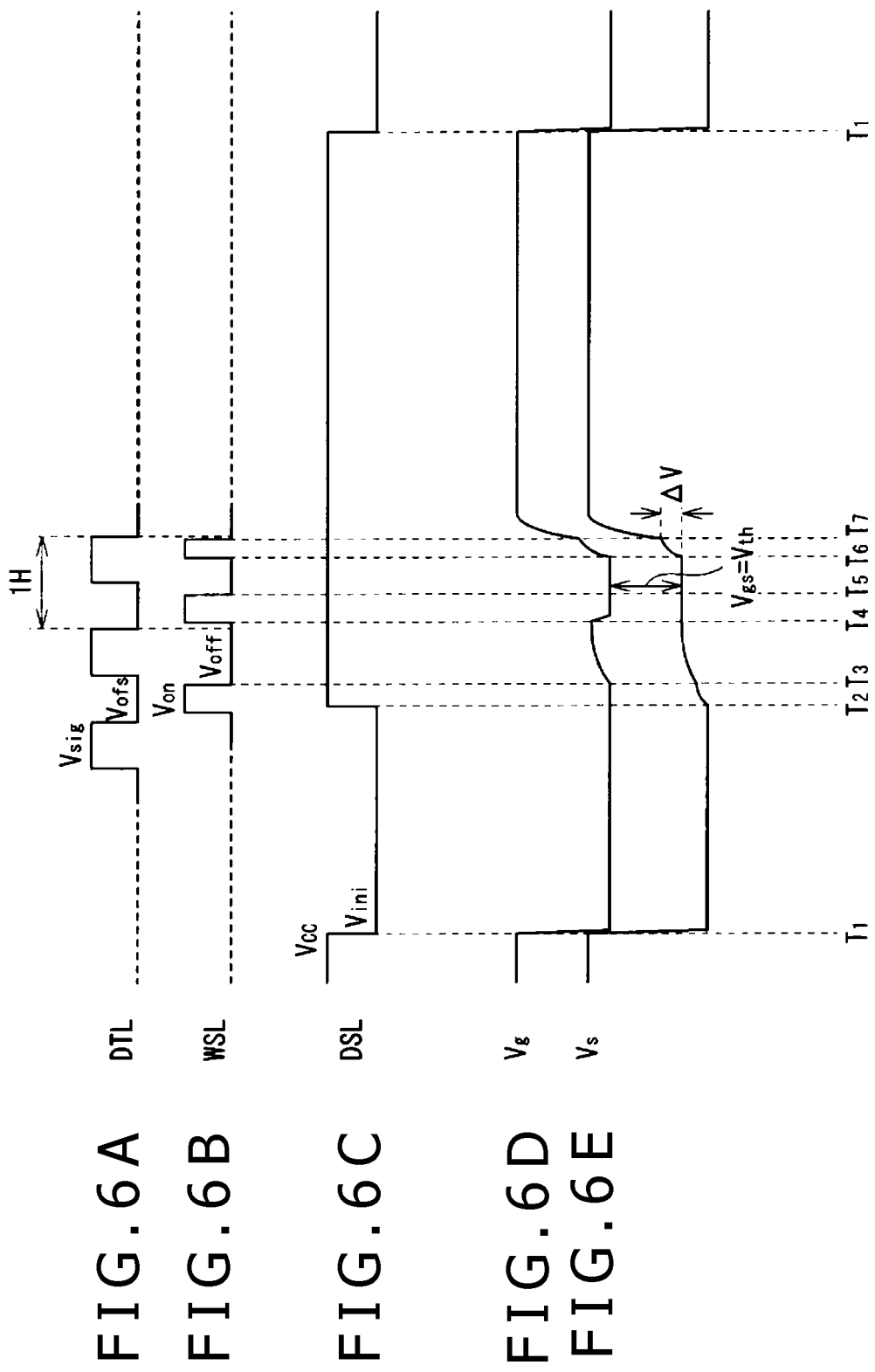
FIGS. 6A to 6E are diagrams illustrating examples of waveforms in relation to the subpixel shown in FIG. 2.

FIGS. 6A to 6E illustrate examples of waveforms of the voltages applied to the pixel circuit 12 and examples of changes in a gate voltage Vg and source voltage Vs of the drive transistor Tdr. FIG. 6A illustrates a signal voltage Vsig and offset voltage Vofs applied to the data line DTL. FIG. 6B illustrates voltages Von and Voff applied to the gate line WSL. The voltage Von turns ON the write transistor Tws, and the voltage Voff turns OFF the write transistor Tws. FIG. 6C illustrates voltages Vcc and Vini applied to the drain line DSL. Further, FIGS. 6D and 6E illustrate the moment-to-moment changes in the gate voltage Vg and source voltage Vs of the drive transistor Tdr in response to the application of the voltages to the drain line DSL, data line DTL and gate line WSL.

(Preparation Period for Threshold Correction)

First, preparations are made for the threshold correction. More specifically, when the voltage of the gate line WSL is at Voff, and that of the drain line DSL is at Vcc (that is, when the organic EL element 11 emits light), the drain line drive circuit 25 brings the voltage of the drain line DSL from Vcc down to Vini (T1). As a result, the source voltage Vs drops to Vini, causing the organic EL element 11 to stop emitting light. Then, when the voltage of the data line DTL is at Vofs, the gate line drive circuit 24 brings the voltage of the gate line WSL from Voff up to Von, changing the gate voltage of the drive transistor Tdr to Vofs.

(First Threshold Correction Period)

Next, the threshold correction is performed. More specifically, when the write transistor Tws is ON, and the voltage of the data line DTL is at Vofs, the drain line drive circuit 25 brings the voltage of the drain line DSL from Vini up to Vcc (T2). As a result, a current Ids flows from the drain to source of the drive transistor Tdr, thus raising the source voltage Vs. Then, before the data line drive circuit 23 changes the voltage of the data line DTL from Vofs to Vsig, the gate line drive circuit 24 brings the voltage of the gate line WSL from Von down to Voff (T3). This causes the gate of the drive transistor Tdr to float, thus causing the threshold correction to pause.

(First Pause Period of the Threshold Correction)

During a pause period of the threshold correction, for example, the voltage of the data line DTL is sampled in a row different from that (pixel) which underwent the threshold correction. It should be noted that, at this time, the source voltage Vs is lower than Vofs-Vth (where Vth is the threshold voltage of the drive transistor Tdr) in the row (pixel) which underwent the threshold correction. During a pause period of the threshold correction, therefore, the current Ids flows from the drain to source of the drive transistor Tdr in the row (pixel) which underwent the threshold correction, thus raising not only the source voltage Vs but also the gate voltage Vg because of the coupling via the holding capacitor Cs.

(Second Threshold Correction Period)

Next, the threshold correction is performed again. More specifically, when the pixel circuit 12 is ready for threshold correction because the voltage of the data line DTL is at Vofs, the gate line drive circuit 24 brings the voltage of the gate line WSL from Voff up to Von, changing the gate voltage of the drive transistor Tdr to Vofs (T4). At this time, if the source voltage Vs is lower than Vofs-Vth (if the threshold correction has yet to be complete), the current Ids flows from the drain to source of the drive transistor Tdr until the drive transistor Tdr goes into cutoff (until a gate-to-source voltage Vgs reaches Vth). Then, before the data line drive circuit 23 changes the voltage of the data line DTL from Vofs to Vsig, the gate line drive circuit 24 brings the voltage of the gate line WSL from Von down to Voff (T5). This causes the gate of the drive transistor Tdr to float, thus maintaining the gate-to-source voltage Vgs constant irrespective of the magnitude of the voltage of the data line DTL.

It should be noted that if, during the threshold correction period, the holding capacitor Cs is charged to Vth, and therefore, the gate-to-source voltage Vgs reaches Vth, the drive circuit 20 terminates the threshold correction. However, if the gate-to-source voltage Vgs does not reach Vth, the drive circuit 20 repeats the threshold correction and pause until the gate-to-source voltage Vgs reaches Vth.

(Writing and Mobility Correction Period)

The pause period of the threshold correction is followed by the writing and mobility correction. More specifically, when the voltage of the data line DTL is at Vsig, the gate line drive circuit 24 brings the voltage of the gate line WSL from Voff up to Von (T6), connecting the gate of the drive transistor Tdr to the data line DTL. This brings the gate voltage Vg of the drive transistor Tdr equal to the voltage Vsig of the data line DTL. At this time, the anode voltage of the organic EL element 11 is still smaller than a threshold voltage Vel of the organic EL element 11. Therefore, the organic EL element 11 is still in cutoff. As a result, the current Ids flows into the element capacitance (not shown) of the organic EL element 11, thus charging the element capacitance. This raises the source voltage Vs by ΔV, thus bringing the gate-to-source voltage Vgs equal to Vsig+Vth−ΔV before long. The writing and mobility correction are performed at the same time as described above. Here, the greater the mobility of the drive transistor Tdr, the greater ΔV. Therefore, the variation in mobility between the subpixels 13 can be eliminated by reducing the gate-to-source voltage Vgs by ΔV before light emission.

(Bootstrapping Period)

Finally, the gate line drive circuit 24 brings the voltage of the gate line WSL from Von down to Voff (T7). This causes the gate of the drive transistor Tdr to float, thus causing the current Ids to flow from the drain to source of the drive transistor Tdr and raising the source voltage Vs. As a result, a voltage greater than the threshold voltage Vel is applied to the organic EL element 11, thus causing the organic EL element 11 to emit light at a desired brightness.

As described above, in the display device 1 according to the present embodiment, the pixel circuit 12 is controlled to turn ON and OFF in each of the subpixels 13. As a result, a drive current is injected into the organic EL element 11 of each of the subpixels 13. This recombines holes and electrons followed by light emission, after which emitted light is externally extracted. As a result, an image is displayed in the display region 10A of the display panel 10.

[Effect]

A description will be given next of the effect of the display device 1 according to the present embodiment.

Figure 14:
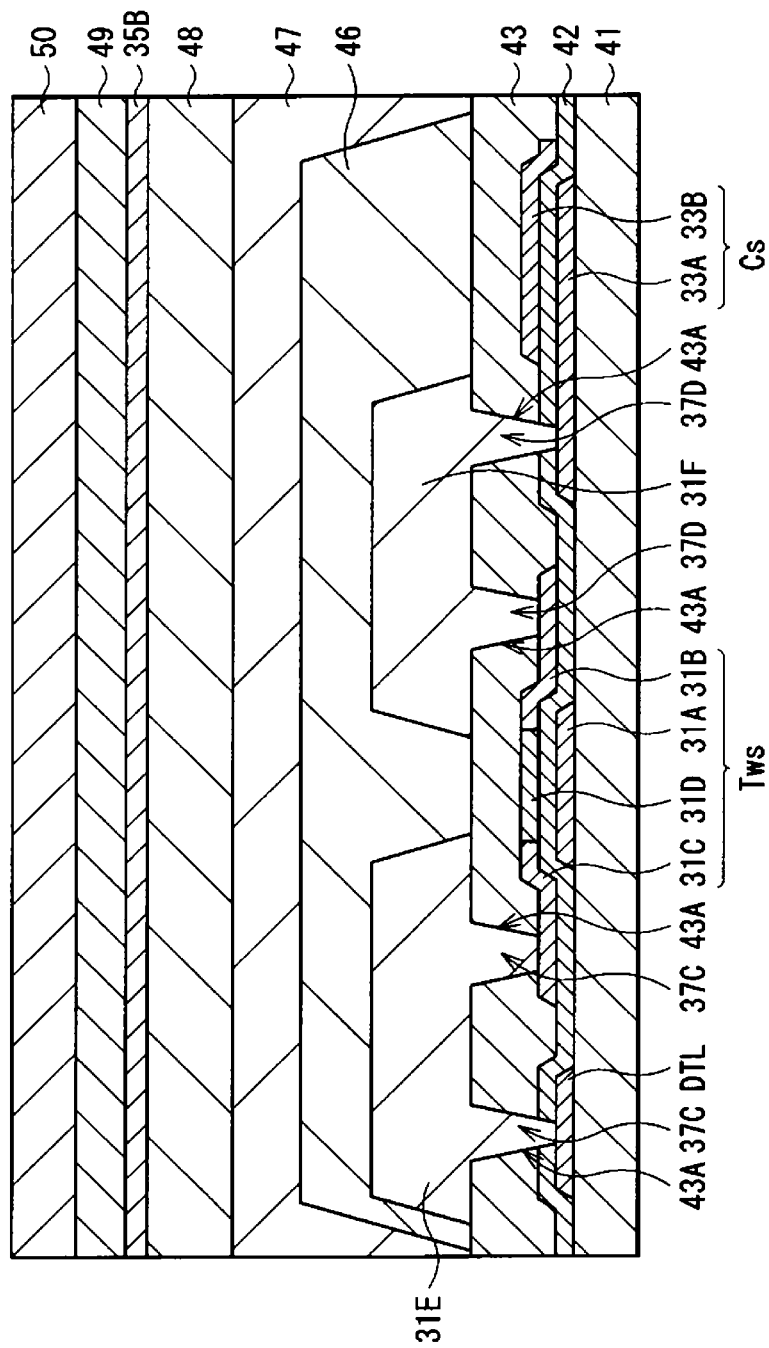
FIG. 14 is a diagram illustrating an example of cross-sectional structure of the portion of a subpixel in related art equivalent to that along line A-A shown in FIG. 3.
Figure 15:
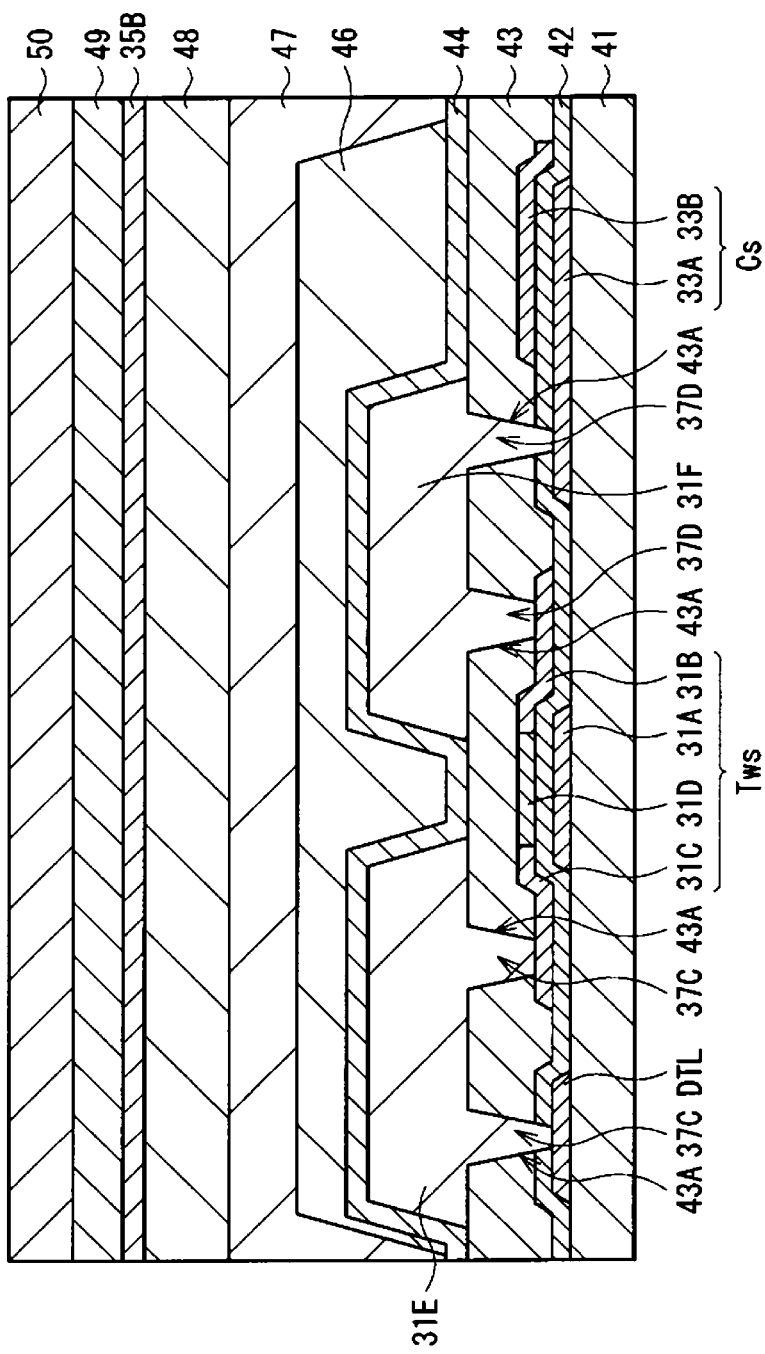
FIG. 15 is a diagram illustrating another example of the cross-sectional structure of the portion of the subpixel in related art equivalent to that along line A-A shown in FIG. 3.

In general, if the display device is a bottom emission display device for extraction of EL light, a color filter is formed on or above the TFT circuitry. As illustrated in FIG. 14, for example, the color filter 46 is directly in contact with the drain lead-out electrode 31E and source lead-out electrode 31F. Alternatively, as illustrated in FIG. 15, for example, the color filter 46 is in contact with the drain lead-out electrode 31E and source lead-out electrode 31F via the thin insulating layer 44. However, the color filter becomes charged when it receives EL light from the organic EL element, thus changing the TFT characteristic because of the charge collected on the color filter.

Figure 16:
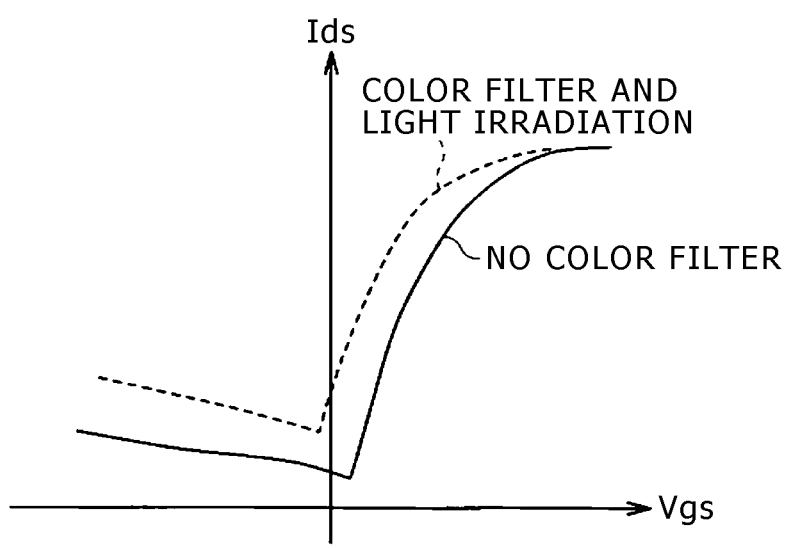
FIG. 16 is a characteristic diagram for describing the change in characteristic of an organic EL element caused by the charging of a color filter.

For example, it is clear as illustrated in FIG. 16 that the TFT characteristic of an n-channel transistor with a color filter, provided thereon or thereabove, irradiated with EL light is different from that with no color filter near the n-channel transistor. More specifically, the TFT threshold voltage has moved in the negative direction, with a greater leak current in the OFF condition. If a TFT whose characteristic has undergone such a change is used as a write transistor, the charge held by the holding capacitor in the pixel circuit leaks during the light emission period, thus resulting in lower brightness.

In the present embodiment, on the other hand, the conductive layer 45 more conductive than the color filter 46 is formed between the pixel circuit 12 and color filter 46 in the bottom emission display panel 10. This ensures that even if the color filter 46 becomes charged as a result of reception of EL light from the organic EL element 11, the pixel circuit 12 does not readily become affected by the charging of the color filter 46. This can reduce the change in characteristic of the write transistor Tws caused by the charging of the color filter 46.

[Modification Example]

Figure 7:
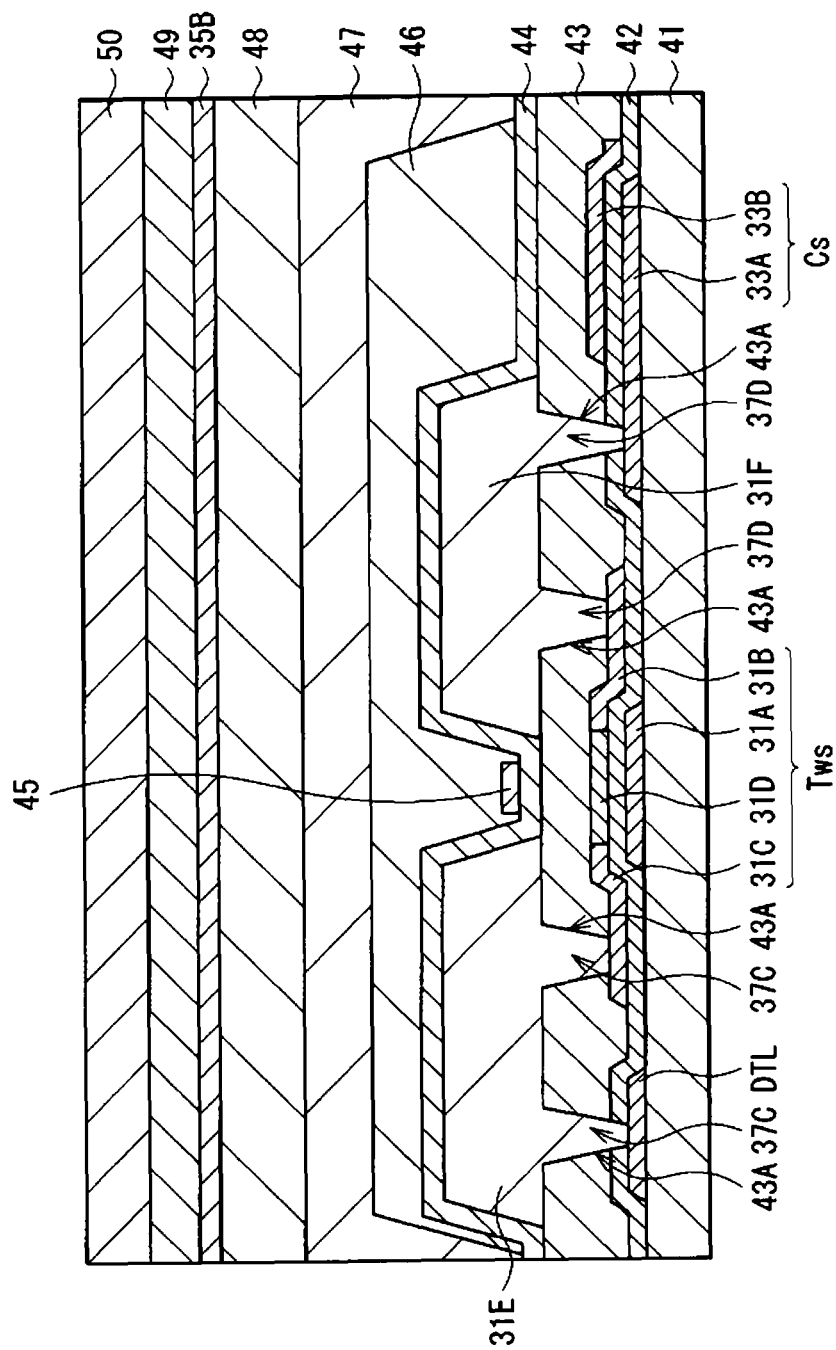
FIG. 7 is a diagram illustrating another example of the cross-sectional structure of the subpixel shown in FIG. 3 as seen in the direction of arrow A-A.

In the above embodiment, the conductive layer 45 covers at least the channel 31D of the write transistor Tws of all the region of the write transistor Tws opposed to the color filter 46. However, the conductive layer 45 need only cover at least part of the channel 31D of the write transistor Tws of all the region of the write transistor Tws opposed to the color filter 46. As illustrated in FIG. 7, for example, the conductive layer 45 need only cover part of the channel 31D of all the region of the write transistor Tws opposed to the color filter 46. Even in such a case, the change in the characteristic of the write transistor Tws caused by the charging of the color filter 46 can be reduced as compared to the absence of the conductive layer 45.

<2. Module and Application Examples>

A description will be given below of application examples of the display device 1 described in the above embodiment and modification example. The display device 1 is applicable to electronic equipment across all disciplines adapted to display a video signal fed thereto or generated therein as an image or picture. Among examples of electronic equipment are television set, digital camera, laptop personal computer, personal digital assistance such as mobile phone and video camcorder.

[Module]

Figure 8:
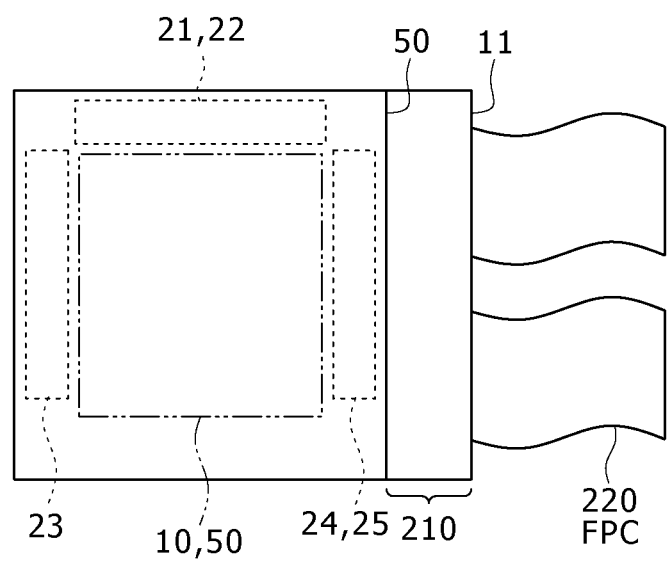
FIG. 8 is a plan view illustrating the schematic configuration of a module including the display device according to a modification example of the embodiment.

The display device 1 is built into a variety of electronic equipment including application examples 1 to 5 as a module as shown, for example, in FIG. 8. This module is manufactured, for example, as follows. That is, a region 210 exposed from a member (not shown) adapted to seal the display panel 10 is provided on one side of a substrate 3. Then, the interconnects of the timing generation circuit 21, video signal processing circuit 22, data line drive circuit 23, gate line drive circuit 24 and drain line drive circuit 25 are extended to this exposed region 210, thus forming external connection terminals (not shown). An FPC (flexible printed circuit) 220 adapted to exchange signals may be provided on the external connection terminals.

APPLICATION EXAMPLE 1

Figure 9:
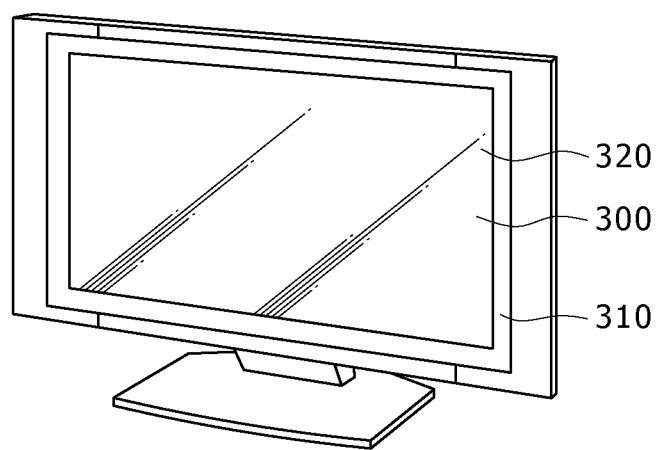
FIG. 9 is a perspective view illustrating the appearance of application example 1 of the display device according to the embodiment and modification example thereof.

FIG. 9 illustrates the appearance of a television set to which the display device 1 is applied. This television set has, for example, a video display screen section 300 including a front panel 310 and filter glass 320. The video display screen section 300 includes the display device 1.

APPLICATION EXAMPLE 2

Figure 10A:
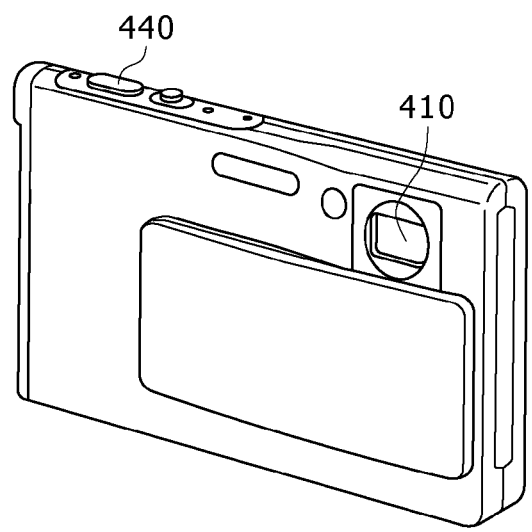
FIG. 10A is a perspective view illustrating the appearance of application example 2 as seen from the front, and 10B is a perspective view illustrating the appearance thereof as seen from the back.
Figure 10B:
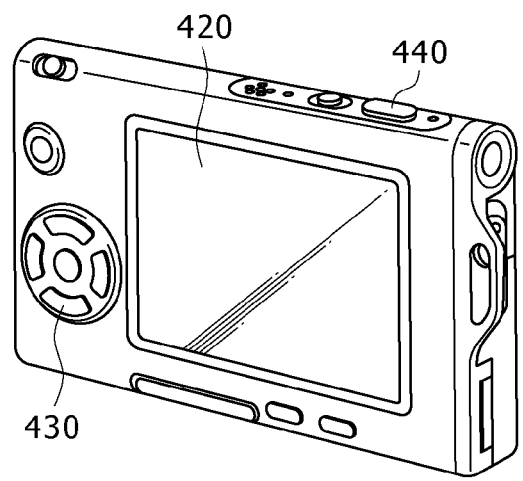

FIGS. 10A and 10B illustrate the appearance of a digital camera to which the display device 1 is applied. This digital camera has, for example, a flash-emitting section 410, display section 420, menu switch 430 and shutter button 440. The display section 420 includes the display device 1.

APPLICATION EXAMPLE 3

Figure 11:
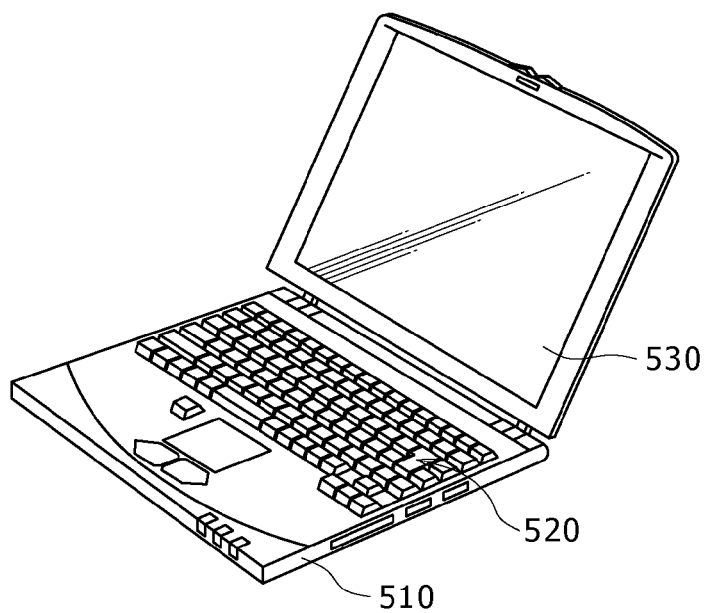
FIG. 11 is a perspective view illustrating the appearance of application example 3.

FIG. 11 illustrates the appearance of a laptop personal computer to which the display device 1 is applied. This laptop personal computer has, for example, a main body 510, keyboard 520 adapted to be manipulated for entry of text or other information and a display section 530 adapted to display an image. The display section 530 includes the display device 1.

APPLICATION EXAMPLE 4

Figure 12:
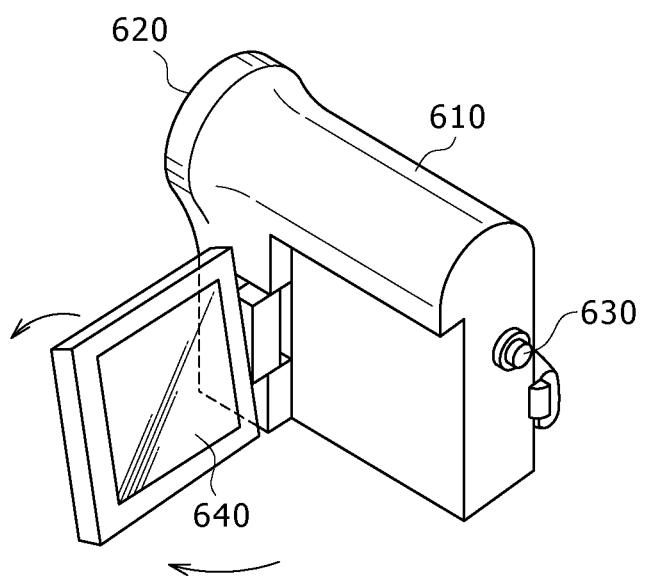
FIG. 12 is a perspective view illustrating the appearance of application example 4.

FIG. 12 illustrates the appearance of a video camcorder to which the display device 1 is applied. This video camcorder has, for example, a main body section 610, lens 620 provided on the front-facing side surface of the main body section 610 to capture the image of the subject, imaging start/stop switch 630 and display section 640. The display section 640 includes the display device 1.

APPLICATION EXAMPLE 5

FIGS. 13A to 13G illustrate the appearance of a mobile phone to which the display device 1 is applied. This mobile phone is made up, for example, of an upper enclosure 710 and lower enclosure 720 that are connected together with a connecting section (hinge section) 730 and has a display 740, subdisplay 750, picture light 760 and camera 770. The display 740 or subdisplay 750 includes the above display device 1.

Although described above with reference to the preferred embodiment and application examples, the present disclosure is not limited thereto and may be modified in various ways.

It should be understood by those skilled in the art that various modifications, combinations, sub-combinations and alterations may occur depending on design requirements and other factors insofar as they are within the scope of the appended claims or the equivalents thereof.

In the above embodiment and others, for example, a case has been described in which the present disclosure is applied to a display device. However, the present disclosure is applicable, for example, to a lighting device.

Further, a case has been described in the above embodiment and others in which the display device is an active matrix display device. However, the configuration of the pixel circuit 12 adapted to achieve active matrix driving is not limited to that described in the present embodiment. Therefore, it is possible to add capacitive elements and transistors to the pixel circuit 12 as necessary. In this case, a necessary drive circuit may be added in addition to the timing generation circuit 21, video signal processing circuit 22, data line drive circuit 23, gate line drive circuit 24 and drain line drive circuit 25 to accommodate the changes made to the pixel circuit 12.

Still further, in the above embodiment and others, the timing generation circuit 21 and video signal processing circuit 22 control the driving performed by the data line drive circuit 23, gate line drive circuit 24 and drain line drive circuit 25. However, other circuits may control the driving. On the other hand, the data line drive circuit 23, gate line drive circuit 24 and drain line drive circuit 25 may be controlled by hardware (circuitry) or software (program).

Still further, in the above embodiment and others, a description has been given assuming that the source and drain of the write transistor Tws and those of the drive transistor Tdr are fixed. It is, however, needless to say that the source-drain orientation may be reversed from that described above depending on the current flow direction.

Still further, in the above embodiment and others, a description has been given assuming that the write transistor Tws and drive transistor Tdr include n-channel MOS TFTs. However, at least one of the write transistor Tws and drive transistor Tdr may include a p-channel MOS TFT. It should be noted that if the drive transistor Tdr includes a p-channel MOS TFT, the anode 35A of the organic EL element 11 serves as a cathode, and the cathode 35B thereof as an anode in the above embodiment and others. Still further, in the above embodiment and others, the write transistor Tws and drive transistor Tdr need not necessarily include amorphous silicon TFTs or micro-silicon TFTs. Instead, the same transistors Tws and Tdr may include low-temperature polysilicon TFTs.

What is claimed is:

1. A light-emitting panel comprising:
an organic electroluminescence element;
a pixel circuit;
a color filter; and
a conductive layer, wherein
the pixel circuit is disposed on a transparent substrate and includes a holding capacitor, a first transistor connected to the holding capacitor, and a second transistor connected to the organic electroluminescence element,
wherein the color filter is disposed between the first transistor and the organic electroluminescence element,
wherein the conductive layer is disposed between the first transistor and the color filter, and
wherein the conductive layer electrically floats.

2. The light-emitting panel of claim 1, wherein the first transistor has a gate, source, drain and channel, and the conductive layer covers part of the channel of all of a region of the first transistor opposed to the color filter.

3. The light-emitting panel of claim 1, wherein the first transistor is insulated from the conductive layer by an insulating layer for isolation.

4. The light-emitting panel of claim 1, wherein the light-emitting panel has a bottom emission structure.

5. A display device comprising:
a display panel; and
a drive circuit adapted to drive the display panel,
wherein, the display panel includes an organic electroluminescence element, a pixel circuit, a color filter, and a conductive layer,
the pixel circuit is disposed on a transparent substrate and includes a holding capacitor, a first transistor connected to the holding capacitor, and a second transistor connected to the organic electroluminescence element,
wherein the color filter is disposed between the first transistor and the organic electroluminescence element,
wherein the conductive layer is disposed between the first transistor and the color filter, and
wherein the conductive layer electrically floats.

6. The display device of claim 5, wherein the first transistor has a gate, source, drain and channel, and the conductive layer covers part of the channel of all of a region of the first transistor opposed to the color filter.

7. The display device of claim 5, wherein the first transistor is insulated from the conductive layer by an insulating layer for isolation.

8. The display device of claim 5, wherein the display panel has a bottom emission structure.

9. An electronic apparatus including the display device of claim 5.

10. A light-emitting panel comprising:
an organic electroluminescence element;
a pixel circuit;
a lead-out electrode;
a color filter disposed between a transistor and the organic electroluminescence element; and
a conductive layer disposed between the transistor and the color filter,
wherein the pixel circuit is disposed on a transparent substrate and includes a holding capacitor, a first transistor connected to the holding capacitor, and a second transistor connected to the organic electroluminescence element, and
wherein the conductive layer is not electrically connected to the lead-out electrode.

11. An electronic apparatus including the light-emitting panel of claim 10.

12. The light-emitting panel of claim 10, wherein the conductive layer is electrically connected to a conductive member different from the conductive layer so as to assume a predetermined potential.

\* \* \* \* \*